(12) United States Patent
Singh et al.

(10) Patent No.: US 6,585,538 B2
(45) Date of Patent: *Jul. 1, 2003

(54) CONTINUOUS CONDUCTOR CONNECTOR SYSTEM FOR PRINTED CIRCUIT BOARDS

(75) Inventors: Harvinder Singh, Shelby Township, MI (US); Vijay Patel, Westland, MI (US); Michael Howey, Canton, MI (US); Bharat Patel, Canton, MI (US); Jin Zhou, Troy, MI (US)

(73) Assignee: Visteon Global Technologies, Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,296

(22) Filed: Apr. 20, 2000

(65) Prior Publication Data

US 2002/0151210 A1 Oct. 17, 2002

Related U.S. Application Data

(60) Provisional application No. 60/130,860, filed on Apr. 22, 1999.

(51) Int. Cl.[7] .................................................. H01R 9/07
(52) U.S. Cl. ........................ 439/495; 439/564; 361/785
(58) Field of Search ............................... 439/495, 260, 439/607, 926, 59, 108, 74, 592, 593, 67, 77, 496, 497, 567; 361/742, 758, 770, 769, 804, 791, 822, 785, 787, 789

(56) References Cited

U.S. PATENT DOCUMENTS

| | | | | |
|---|---|---|---|---|
| 3,487,350 A | * | 12/1969 | Hammell | 439/567 |
| 3,801,388 A | | 4/1974 | Akiyama et al. | 156/3 |
| 4,121,044 A | * | 10/1978 | Hadersheck et al. | 174/68.5 |
| 4,193,659 A | * | 3/1980 | Deverrewaere | 439/17 D |
| 4,404,059 A | | 9/1983 | Livshits et al. | 156/629 |
| 5,044,980 A | * | 9/1991 | Krumme et al. | 439/496 |
| 5,083,939 A | * | 1/1992 | Ittah | 439/496 |
| 5,194,010 A | * | 3/1993 | Dambach et al. | 439/79 |
| 5,316,486 A | * | 5/1994 | Tanaka et al. | 439/59 |
| 5,738,545 A | * | 4/1998 | Igarashi et al. | 439/607 |
| 5,738,797 A | | 4/1998 | Belke, Jr. et al. | 216/16 |
| 5,885,091 A | * | 3/1999 | Belanger, Jr. et al. | 439/67 |
| 5,917,709 A | * | 6/1999 | Johnson et al. | 361/803 |
| 5,928,003 A | * | 7/1999 | Kajinuma | 439/74 |
| 6,135,781 A | * | 10/2000 | Pope et al. | 439/59 |

* cited by examiner

*Primary Examiner*—P. Austin Bradley
*Assistant Examiner*—Phuongchi Nguyen
(74) *Attorney, Agent, or Firm*—Frank Lollo

(57) ABSTRACT

A connector system for printed circuit boards uses extensions of the traces of the printed circuit board as connector pins by supporting the malleable traces with isolated support pillars. This eliminates the need for electrical junctions between the connector and the printed circuit board. The support pillars provide the necessary mechanical properties for the connector pins. The conductive trace may be adhered to one side of the support or may be draped over the top to cover both sides and may be plated with the material of the support to provide a uniform electrical conductivity over the surface of the formed pin.

16 Claims, 6 Drawing Sheets

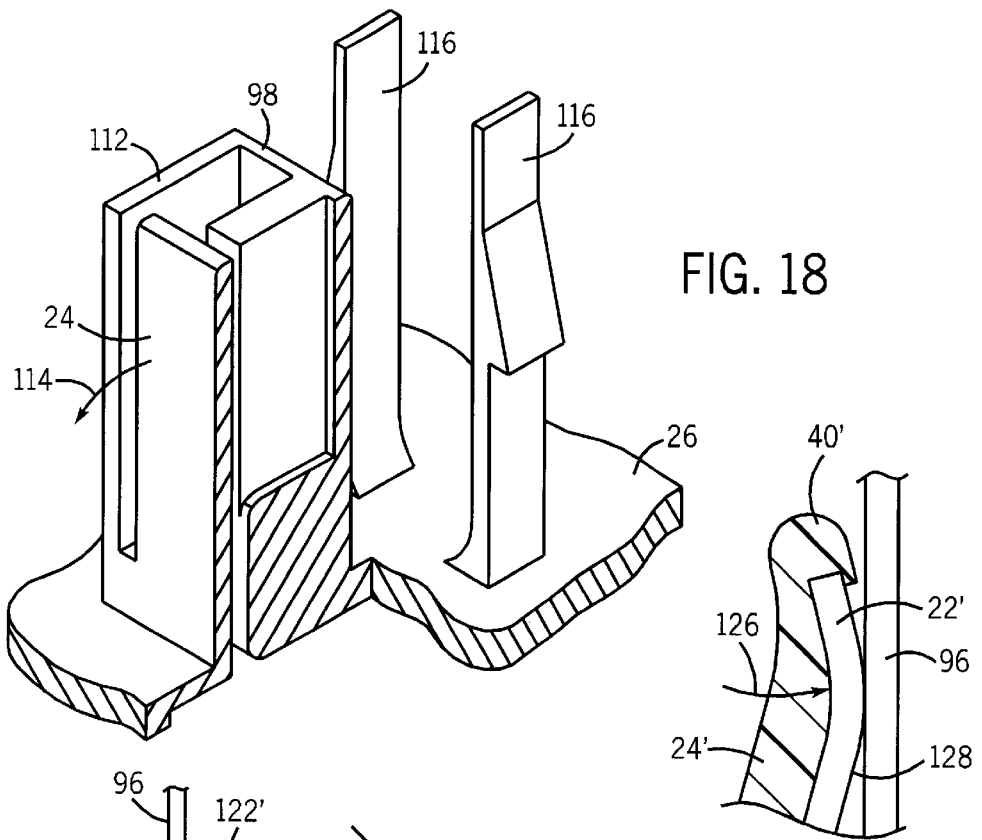
FIG. 18
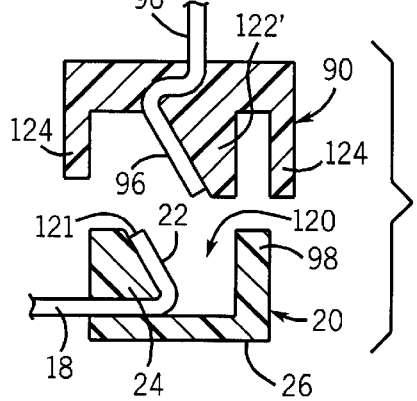
FIG. 21
FIG. 19
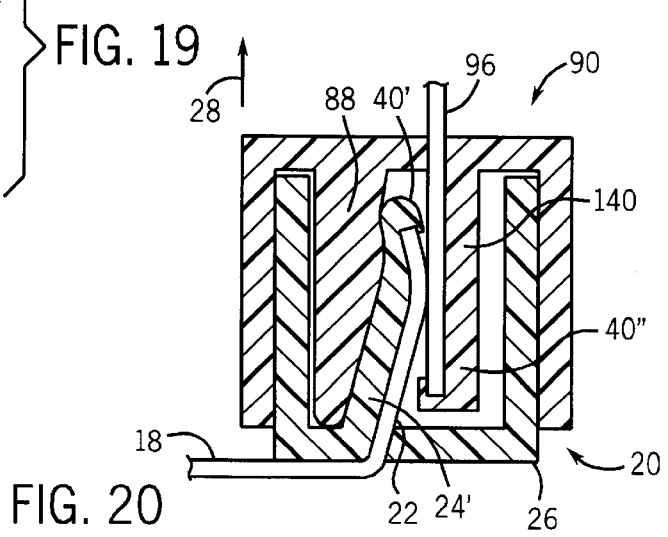
FIG. 20

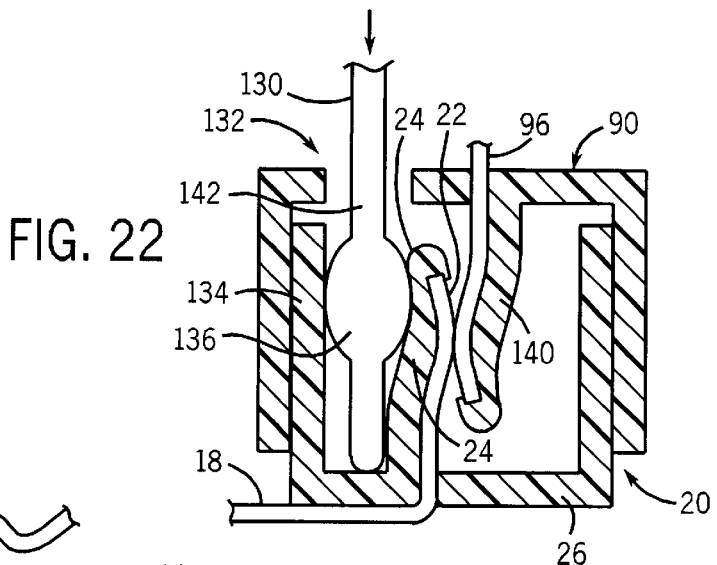
FIG. 22
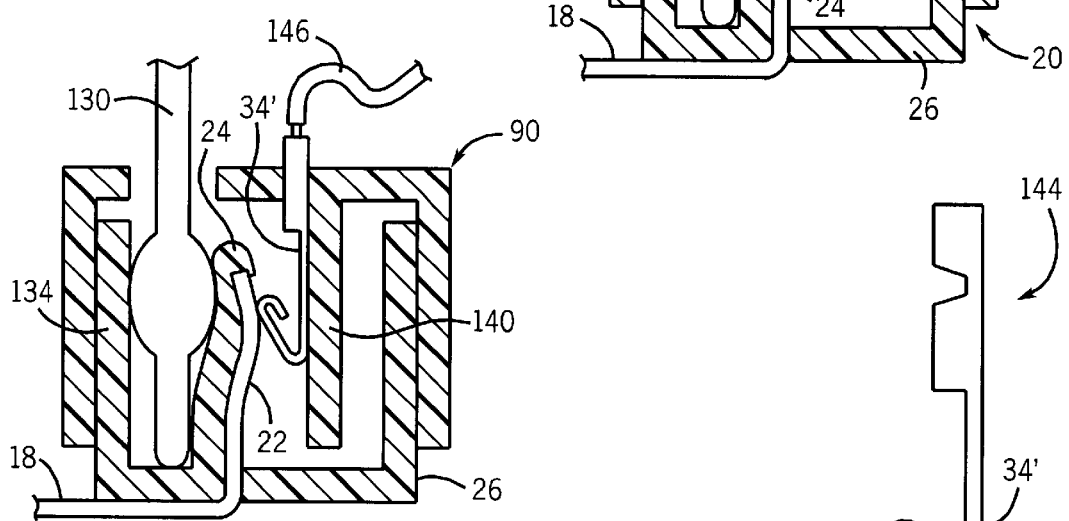
FIG. 23
FIG. 24
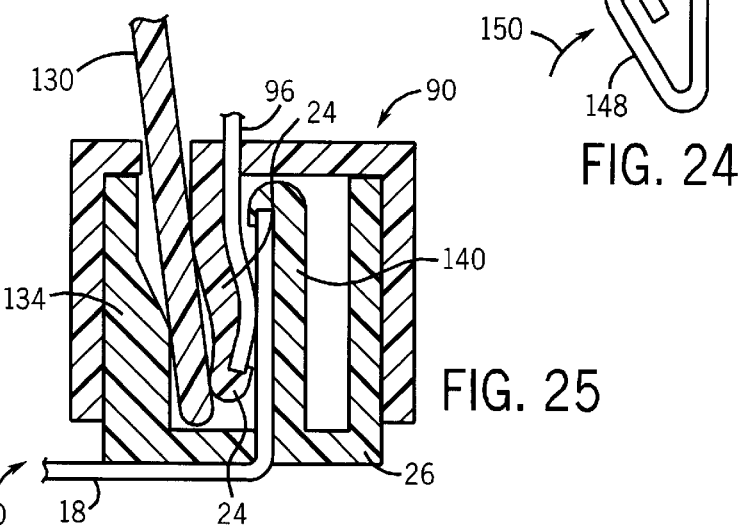
FIG. 25

CONTINUOUS CONDUCTOR CONNECTOR SYSTEM FOR PRINTED CIRCUIT BOARDS

CROSS-REFERENCE TO RELATED APPLICATIONS

This application claims priority to Provisional Application No. 60/130,860, filed Apr. 22, 1999.

STATEMENT REGARDING FEDERALLY SPONSORED RESEARCH OR DEVELOPMENT

- - -

BACKGROUND OF THE INVENTION

The present invention relates to printed circuit boards having conductive layers laminated to an insulating substrate and, in particular, to a connector system for such printed circuit boards making use of portions of the conductive layer as connector conductors.

Printed circuit boards are used to provide for the highly reliable and robust connection of circuit components. Such circuit boards substantially reduce the cost of interconnecting circuit components in contrast to point-to-point wiring, but nevertheless, often require point-to-point wiring through wiring harnesses between the circuit board and other vehicle components. Such harnesses can be costly and present additional points of possible failure both in the connection of the harness wiring to the printed circuit board conductors and in the connection of the harness wiring to the connector pins.

BRIEF SUMMARY OF THE INVENTION

The present invention recognizes that point-to-point wiring harnesses may be avoided by using flexible circuit boards with short harness-like extensions connecting the circuit board to nearby components. The need for a crimp or solder-type connection between the harness-like extensions and connectors is eliminated by using the conductive layer of the printed circuit board as part of the connector in lieu of separate connector pins or sockets. The connector housing supports the normally malleable conductive layer of the printed circuit board providing the necessary rigidity and elasticity needed for connector conductors.

Specifically then, the present invention provides a circuit board connector assembly including a printed circuit board having a lower insulating substrate and an upper conductive layer. The upper conductive layer has at least one extenuate conductive finger bent upward. A connector half receives and supports the conductive finger, the connector half sized to mate with a corresponding connector half having a second conductive finger. The mating of the connector halves positions the conductive finger and second conductive finger in electrical contact.

Thus, it is one object of the invention to provide a connector system for printed circuit boards and does not require a separate electrical connection to be made between the conductors of the printed circuit board and the conductors of the connector. By using the conductive layer of the printed circuit board, a simple, robust and continuous conductive path is provided.

The conductive finger of the printed circuit board may be detached from the insulating substrate of the printed circuit board or alternatively, the insulating substrate of the printed circuit board may be cut around the conductive finger and both the conductive finger and its insulating substrate bent upward, the insulating substrate remaining attached to the upwardly bent conductive finger.

It is thus another object of the invention to provide a flexible system that may be adapted to printed circuit boards in which the conductive layer may be easily separated from its insulating substrate and to printed circuit boards in which the flexible substrate may be incorporated into the connector.

The conductive finger may be supported on the connector half by an electrically isolated pillar.

It is another object of the invention to obtain the necessary mechanical characteristics needed for connector conductors from the soft material of the conductive layer by using portions of the connector shell material to support the conductive finger.

The conductive finger may be longer than the height of the electrically isolated pillar and attached at its back surface to a first side of the electrically isolated pillar to bend over the top of the electrically isolated pillar and attach further to a second obverse side of the electrically isolated pillar.

Thus it is another object of the invention to provide for dual-sided electrical contacts in a connector while nevertheless providing the conductive finger with the necessary mechanical support.

The conductive finger may have a substantially rectangular cross-section with a back side, a front side, and a left and right edge and the electrically isolated pillar may include overhang portions that mechanically capture the left and right edges or alternatively or in addition, the end of the conductive finger.

Thus it is another object of the invention to provide for a strong mechanical attachment of the conductive finger to its dissimilar supporting member.

The end of the conductive finger may be beveled so as to provide a wedge-shaped engagement with the electrically isolated pillar.

Thus it is another object of the invention to provide for mechanical attachment of the conductive finger to the pillar such as may allow a smooth transitional surface between the two such as is desirable for sliding engagement of connector conductor members.

The electrically isolated pillar may include an elastomeric outer portion; the elastomeric outer portion may be convex.

Thus it is another object of the invention to provide for a greater "lead-in" opening for connectors formed by this invention that may accommodate variations in part tolerance while ensuring good sliding contact between the conductive fingers.

The electrically isolated pillar and the conductive finger may be plated with a continuous metallic layer. A non-platable shroud may encase the lower portions of the electrically isolated pillar.

Thus it is another object of the invention to provide multiple conductive surfaces on the connector pins formed by the conductive finger and the electrically isolated pillar similar to conventional connector pin designs and further to allow plating of an assembled part without short circuits being created by the plating between multiple pins.

The connector may include downwardly extending barbs on the electrically isolated pillar sized to be inserted through a stabilizing support to mechanically fix the connector shell or the connector shell may be otherwise attached either through injection molding or other techniques to a mechanically stabilizing surface including but not limited to the substrate of the printed circuit board.

Thus it is another object of the invention to provide a good mechanical connection between the connector so formed and a base fixed relative to the printed circuit board so as to prevent undue tension or strain on the conductive layers forming the conductive finger.

The foregoing and other objects and advantages of the invention will appear from the following description. In the description, reference is made to the accompanying drawings, which form a part hereof, and in which there is shown by way of illustration a preferred embodiment of the invention. Such embodiment does not necessary represent the full scope of the invention, however, and reference must be made to the claims herein for interpreting the scope of the invention.

BRIEF DESCRIPTION OF THE DRAWINGS

FIG. 18 is a fragmentary, perspective view of a connector plug implementing the present invention in which the supporting electrically isolated pillar is provided by one wall of the connector half which cantilevers and including engagement barbs for mechanically retaining the connector half to a mating connector half FIG. 19 is a figure similar to FIG. 12 showing engagement of the two connector halves so as to bring about a diagonal lap joint between supported conductors;

FIG. 20 is a figure similar to that of FIGS. 16 and 17 in which the conductors are retained by overhangs and in which the hinging pillar includes a convex outer surface so that engagement of the conductors bring about the intersection of a cylindrical and a planar surface;

FIG. 21 is a detailed fragmentary view of the hinging pillar of FIG. 20 in contact with an opposing conductor showing the radius of the engaging surface of the hinging pillar;

FIG. 22 is a figure similar to that of FIG. 12 in which a key-wedge having an expanded portion is inserted into the connector halves after the two connector halves are engaged so as to press a hinging pillar out against a stationary contact, and wherein both conductors are given cylindrical outer surfaces for improved contact;

FIG. 23 is a figure similar to that of FIG. 22 wherein the stationary contact is replaced by a spring portion of a crimp connector for use with conventional wiring;

FIG. 24 is a detailed view of the crimp connector of FIG. 23 showing an inward flexure of a contact portion; and FIG. 25 is a figure similar to FIG. 22 wherein the key-wedge interfits with a sloped wall of one connector half so as to flex a hinging pillar inward without need for an expanded section of the key-wedge.

DETAILED DESCRIPTION OF THE INVENTION

Figure 1:
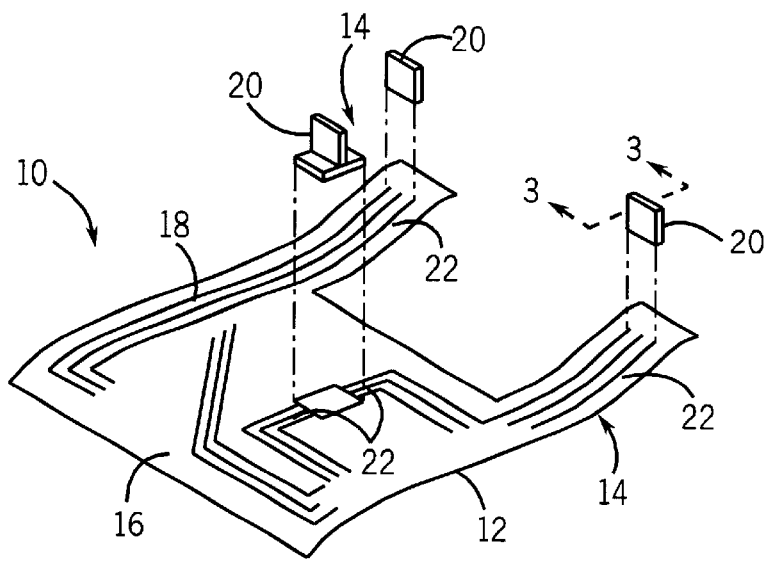
FIG. 1 is a perspective, exploded view of a flexible printed circuit board suitable for use with the present invention showing location of connectors on its surface per the present invention.

Referring now to FIG. 1, a printed circuit board 10 may provide an insulating flexible substrate 12 having upper conductive traces 18 formed from a conductive layer laminated to the flexible substrate 12 according to techniques well known in the art. The conductive traces 18 may be a tri-metal, for example, providing a copper, then aluminum, then copper lamination, produced using the techniques described generally in U.S. Pat. Nos. 4,404,059 to Livshits et al., 3,801,388 to Akiyama et al., and 5,738,797 to Belke as by either subtractive or additive methods.

Generally the conductive traces 18 are relatively soft and malleable as a result of their desired metallurgical properties for printed circuit applications and in particular to flexible printed circuit applications.

The printed circuit board 10 may include a main body 16 lying substantially in a plane and extending along that plane in one or more harness-like extensions 14. Conductive traces 18 may run along these harness-like extensions 14 terminating in conductive fingers 22. Electrical connectors 20 may be attached to the conductive fingers 22 at the ends of the harness-like extensions 14 or to similar conductive fingers 22 within a main body 16 of the printed circuit board 10.

Figure 2:
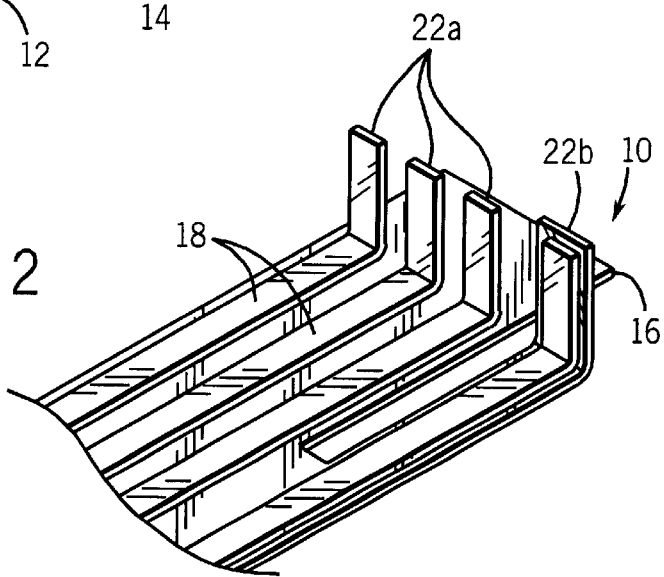
FIG. 2 is an enlarged portion of FIG. 1 showing a bending upward of portions of the conductive traces on the printed circuit board of FIG. 1 to form conductive fingers both by detaching the conductive traces from their insulating substrate and by leaving the conductive traces attached to the insulating substrate.

Referring now to FIG. 2, the conductive fingers 22 at the ends of the harness-like extensions 14 may be bent upward from the principal surface of the printed circuit board 10. In this process, the conductive fingers 22 may leave behind the flexible substrate 12 as shown to produce "free" conductive fingers 22a or alternatively may be bent together with the flexible substrate 12 as shown to produce "attached" conductive fingers 22b. In this latter case, the flexible substrate 12 may be cut about the attached conductive trace 22b to facilitate this bending. Conductive fingers 22a and 22b may be bent at 90 degrees to their adjacent surfaces of the main body 16 of the printed circuit board 10, as shown, or to other angles allowing necessary clearance for a mating connector as will be described below. The free conductive trace 22a may be further pressed and formed to a number of shapes once it is removed from the substrate 12.

Thus bent, conductive fingers 22a or 22b are exposed to be attached to other circuits but alone are insufficiently strong to serve conductive pins in a conventional connector design. For this reason, the bent conductive fingers 22 may be supported by special connector structure.

Figure 3:
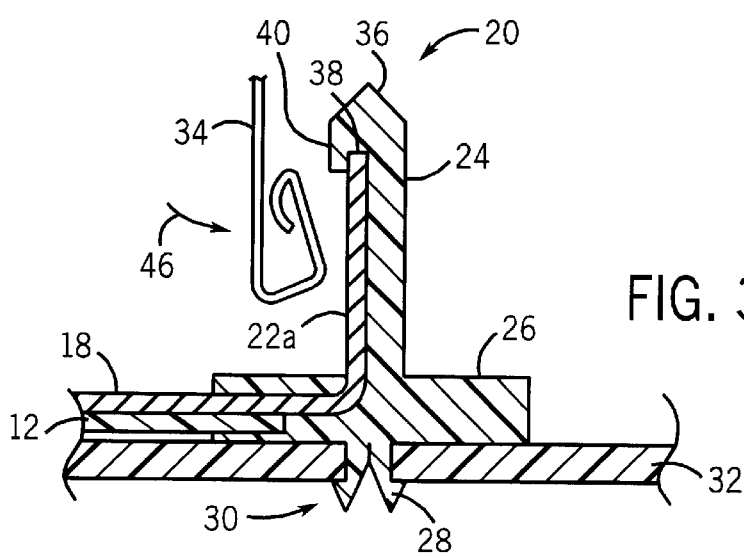
FIG. 3 is a cross-section along lines 3—3 of FIG. 1 through a connector as attached to the printed circuit board, showing support of the conductive fingers of FIG. 2 by an insulating pillar to form a connector pin and further showing interaction of the resulting pin with a conventional spring conductor and further showing attachment of the pin by mechanical barbs to a support.
Figure 4:
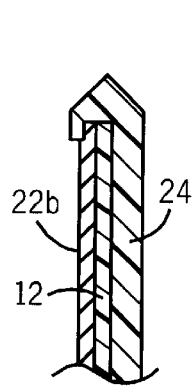
FIG. 4 is a fragmentary view of FIG. 3 showing the attachment of the conductive finger to the insulating pillar when both the conductive finger and its substrate are deformed upward.

Referring now to FIG. 3, free conductive finger 22a may be held against an upstanding electrically isolated pillar 24 extending perpendicularly upward from a base plate 26. The free conductive trace 22a is attached to the electrically isolated pillar 24 so that a front surface of the free conductive trace 22a is exposed on one side of the electrically isolated pillar 24 to be engaged by a conductive element 34 of a mating conductor to be described below. An upper end 38 of the free conductive trace 22a is captured by an overhang 40 of the electrically isolated pillar 24. The electrically isolated pillar 24 may terminate at its uppermost tip with a point 36 to assist in engagement of the electrically isolated pillar 24 with corresponding connector portions.

The base plate 26 may extend generally along a plane of the harness-like extensions 14 and in a first embodiment encapsulates both the conductive trace 18 prior to the bend and its flexible substrate 12 so as to provide a mechanical attachment to the flexible substrate 12. Extending downwardly from the base plate 26 may be elastic barbs 28 of a kind well known in the art for being received in an aperture 30 in an anchor plate 32 generally having a fixed relationship with the remainder of the circuit board 10. The lower surface of the base plate 26 may thus abut the upper surface of the anchor plate 32 to provide resistance against torque placed on the electrically isolated pillar 24 extending upward therefrom.

Figure 8:
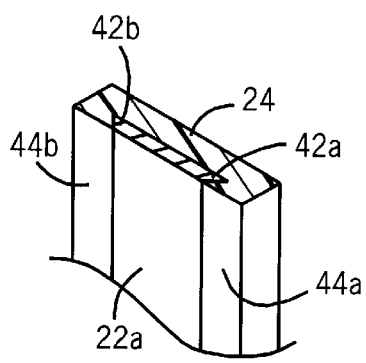
FIG. 8 is a cross-sectional perspective view of the pin of FIG. 3 showing a dovetailing of the conductive finger into the insulating pillar.

Referring also to FIG. 8, the left and right edges 42a and 42b of the free conductive finger 18a may also be captured by corresponding left and right overhangs 44a and 44b of the electrically isolated pillar 24. In this regard, the left and right edges 32a and 32b of the bent ends of the conductive fingers 22 may be beveled so as to form a dove-tail joint providing for mechanical attachment to the electrically isolated pillar 24.

In a preferred embodiment, the electrically isolated pillar 24, base plate 26 and barb 28 if used may be molded as an integral part of a thermoplastic polymer of types well known in the art. Generally, the preferred plastic will be an insulator, however, materials having some conductance, so long as they provide the necessary electrical isolation between multiple pillars 24 that may be found in one connector 20, can also be used.

The electrically isolated pillar 24 provides rigidity to the otherwise ductile free conductive trace 22a so as to resist forces 46 imparted by conductive elements 34 to which it will engage. The electrically isolated pillar 24, nevertheless, also provides some elasticity to accommodate mismatch between mating portions of connector halves and to create a spring-biased engagement of the free conductive trace 22a with an opposing conductive element 34.

Figure 5:
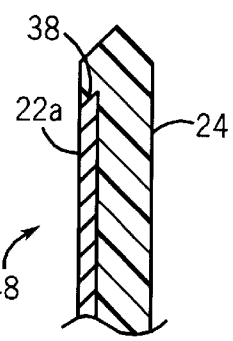
FIG. 5 is a figure similar to that of FIGS. 3 and 4 showing a beveling of the upper edge of the conductive finger to present a substantially smooth interface between the insulating pillar and the conductive finger at its exposed surface.

Referring now to FIG. 5, an attached conductive trace 22b (including a portion of the flexible substrate 12b) may similarly be attached to an electrically isolated pillar 24 using similar mechanical engagement as shown in FIGS. 3 and 8 with the flexible substrate 12 being sandwiched between an upwardly extending portion of the electrically isolated pillar 24 and the attached conductive trace 22b.

Alternatively, either the free conductive trace 22a or the substrate of the attached conductive trace 22b may be attached by adhesives to the electrically isolated pillar 24.

Referring now to FIG. 5, regardless of the method of attachment, a dove-tail joint of FIG. 8 may also be applied to the upper end 38 of the free conductive trace 22a (shown) or the attached conductive trace 22b (not shown) so as to provide mechanical attachment as has been previously mentioned together with a substantially smooth front face 48 where transition between the electrically isolated pillar 24 and the conductive fingers 22 offers no catching ridge to resist the secondary conductive element 34 sliding along this front face 48.

Figure 6:
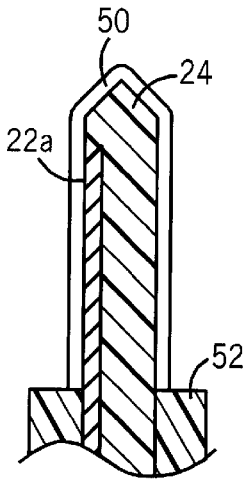
FIG. 6 is figure similar to that of FIGS. 3–5 showing a plating of the pillar and conductive finger of FIG. 5 with a metallic layer, the lower portion of the pin shrouded by a non-plating plastic to prevent shorting.

In another alternative embodiment shown in FIG. 6, the electrically isolated pillar 24 and free conductive trace 22a (or attached conductive trace 22b, not shown) once attached to the electrically isolated pillar 24 may be plated with a metal layer 50 so as to provide a conductive surface on all sides of the electrically isolated pillar 24 as may be useful in some connector designs. The metal layer 50 may be broken at the lower end of the electrically isolated pillar 24 by means of an engaging shroud 52 of non-platable plastic so as to prevent shorts between multiple adjacent pins formed by electrically isolated pillars 24. Other masking techniques may also be used.

Figure 7:
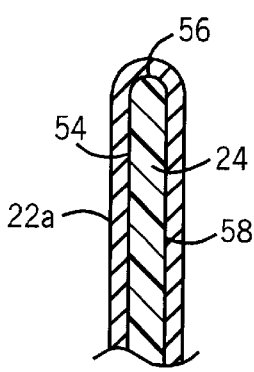
FIG. 7 is a figure similar to that of FIGS. 3 and 6 showing a draping of the conductive finger over the surface of the electrically isolated pillar to provide for a pin conductive on two sides.

Referring now to FIG. 7 in an alternative embodiment, the electrically isolated pillar 24 receives a free conductive trace 22a that is longer than the height of the electrically isolated pillar 24 so that the rear surface of the free conductive trace 22a may be attached first to a front surface 54 of electrically isolated pillar 24, then draped over the upper end 56 of the electrically isolated pillar 24 and attached also to a rear obverse surface 58 of the electrically isolated pillar 24. In this way, conduction of the electrically isolated pillar 24 is provided on two sides as may be useful in some connector designs. The same technique may be applied to the attached conductive trace 22b.

Figure 9:
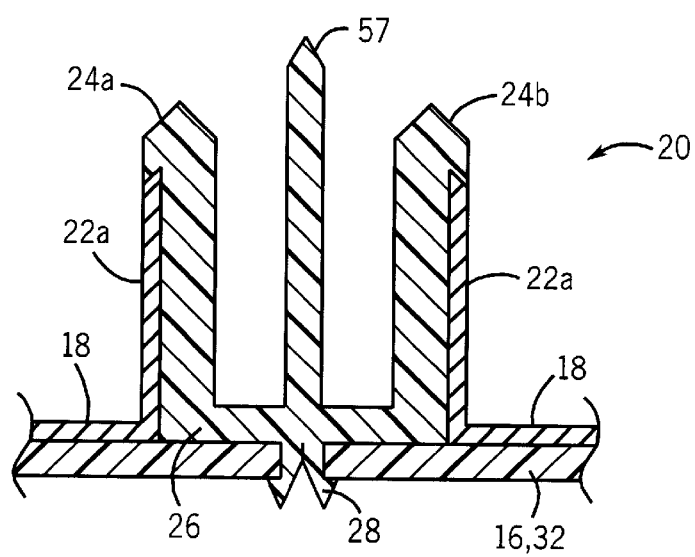
FIG. 9 is a view similar to FIG. 3 showing an alternative embodiment in which two conductive pins are formed about a mechanical alignment pin not having a conductor.

Referring now to FIG. 9, a connector 20 making use of the principles described above may have a barb 28 attaching it to the flexible substrate 12 or an anchor plate 32 as described with respect to FIG. 3 to affix the base plate 26 to an upper surface of the flexible substrate 12 or an anchor plate 32. Conductive traces 18 may approach the base plate 26 from two directions per the connector 20' of FIG. 1 and their corresponding free conductive traces 22a may be attached to electrically isolated pillars 24a and 24b per the technique of FIG. 7.

The electrically isolated pillars 24a and 24b are positioned at the edges of the base plate 26 in opposition about a lead-in pin 57. The positioning of these electrically isolated pillars 24a and 24b and the opposite direction of approach of the conductive fingers 22 provide for a higher density of different pins formed from electrically isolated pillars 24a and 24b.

The mechanical lead-in pin 57 allows forces between mating conductors to be transferred to the barb 28 and for flexure of the electrically isolated pillars 24a and 24b to principally provide good engagement between the free conductive fingers 22a and 22b and their counterpart conductive elements 34.

The electrically isolated pillars 24a and 24b, base plate 26, barbs 28a and 28b, and mechanical lead-in pin 57 may be molded as a single injection molded part of insulating thermoplastic.

Figure 10:
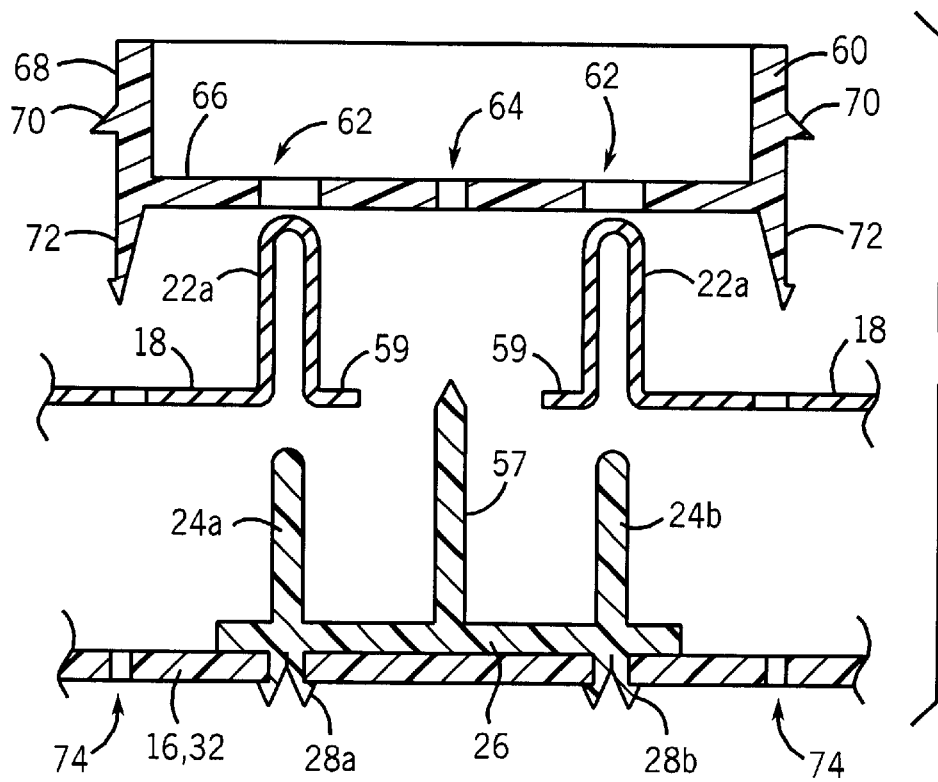
FIG. 10 is a cross-sectional view similar to that of FIG. 3 of yet a further connector embodiment having a multi-pin conductor produced using the draping method of FIG. 7 with separate snap together connector components.

Referring now to FIG. 10, the base plate 26, electrically isolated pillars 24a and 24b, and lead-in pin 57 may be modified to include barbs 28a and 28b extending downward from the base plate 26 beneath the upwardly extending electrically isolated pillars 24a and 24b to firmly anchor the latter against the flexible substrate 12 or an anchor plate 32. Again conductive fingers 22 may approach from different directions the flexible substrate 12. In this case, the free conductive fingers 22a may be longer than twice the height of the electrically isolated pillars 24a and 24b to attach up an outer edge and down an inner edge to the electrically isolated pillars 24a and 24b and then in excess portions 59 running along the upper surface of the horizontal base plate 26 between the electrically isolated pillars 24a and 24b and the mechanical lead-in pin 57.

A connector shell 60 has a horizontal shroud plate 66 including apertures 62 allowing passage of the free conductive traces 22a as formed over the electrically isolated pillars 24a and 24b and aperture 64 allowing passage of mechanical lead-in pin 57 so that shroud plate 66 may abut the upper surface of base plate 26 capturing the excess portions 59 between the shroud plate 66 and base plate 26.

Upstanding shell walls 68 surround the base plate 26 and include on their vertical faces outwardly extending engagement barbs 70 for receiving and holding a mating connector shell according to methods well known in the art. Downwardly extending retainer hooks 72 beneath the walls 68 may pass between or to the side of conductive fingers 22 to be received by corresponding holes 74 in the flexible substrate 12 or anchor plate 32. A similar connector shell 60 may be used with the embodiment of FIG. 6 to provide the shroud 52 as described above by making the connector shell 60 of a non-platable polymer.

Figure 11:
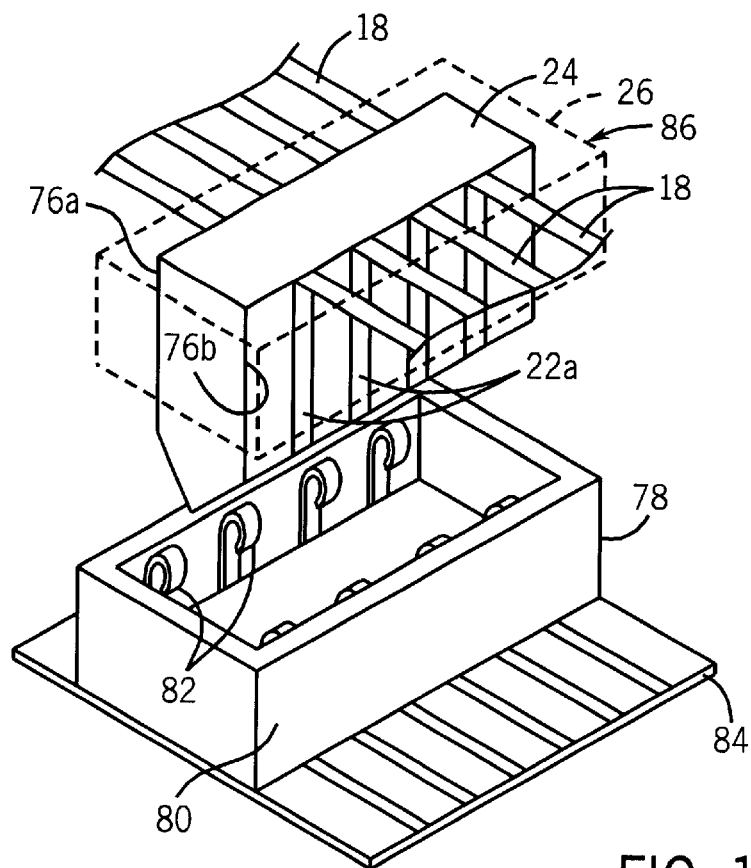
FIG. 11 is an exploded perspective view of a multi-pin conductor using the pin-forming technique of FIG. 7 with a receiving connector using spring elements similar to that as shown in FIG. 3.

Referring now to FIG. 11, the high conductor density enabled by conductive traces 18 approaching a base plate 26 from different directions is shown in an alternative embodiment in which a single electrically isolated pillar 24 supports on its transverse edges 76a and 76b longitudinally displaced multiple free conductive traces 22a. This single electrically isolated pillar 24 may be received by a connector 78 substantially in the form of an open sided box 80 sized to receive the electrically isolated pillar 24 through its open side and surround the same and having arrayed on its inner walls spring conductors 82, each aligned with a different free conductive trace 22a as attached to the faces 76a and 76b of the electrically isolated pillar 24.

Incorporating the needed flexure in the receiving connector 78 and its spring conductors 82 eliminates the need for flexure of the electrically isolated pillar 24. The spring conductors 82 may have crimp fittings attaching them to harness wires or stakes that may attach to a second printed circuit board 84 according to methods well known in the art.

An additional shell 86 shown in phantom may surround the electrically isolated pillar 24 to engage the outer edges of the walls of box 80 such as may also include locking members according to methods well known in the connector art to prevent disengagement of the two connectors.

Figure 12:
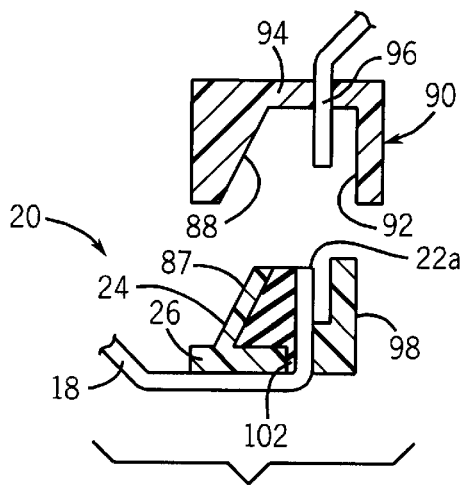
FIG. 12 shows separated connector halves suitable for use with the present invention in which the conductive finger is supported in one connector half by an insulating pillar incorporating an outer elastomer for slight flexure with engagement with a connector pin of the second connector half.

Referring now to FIG. 12, the connector 20 may provide an electrically isolated pillar 24 having one engagement wall 87 opposite to the wall holding the free conductive trace 22a, the engagement wall sloping as it extends upwardly from the base plate 26. Base plate 26 of connector 20 may include an upwardly extending guide wall 98 opposite the electrically isolated pillar 24 about conductive trace 22a to form an engagement wall, a tapered plug being narrow near the top of the connector 20 and becoming wider as one moves down the walls 87 and 98 toward base plate 26.

The plug so formed may be received by a funnel-shaped aperture formed on second connector half by an engagement wall 88 corresponding to engagement wall 87 and opposed wall 92 extending generally perpendicularly to a base 94 of connector half 90 and aligned with an axis along which the connectors 20 and 90 will be engaged. The downward edges of engagement walls 88 and opposed wall 92 fit around and align the plug formed by the walls 87 and 98 when the connector 20 and 90 are mated.

Figure 13:
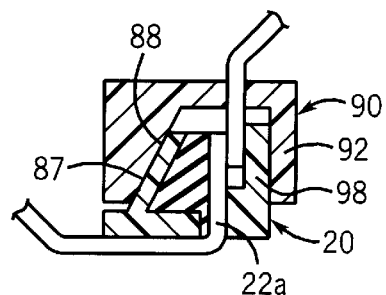
FIG. 13 is a figure similar to that of FIG. 12 showing engagement of the two connector halves of FIG. 12.
Figure 14:
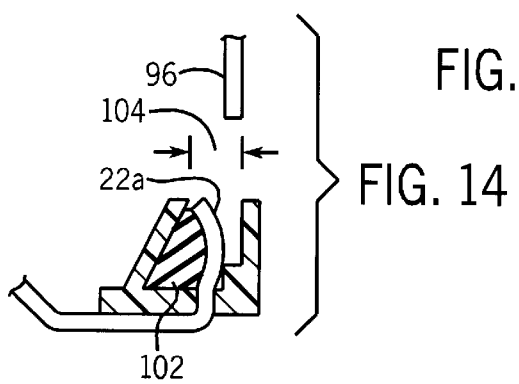
FIG. 14 is a figure similar to that of FIG. 12 showing an alternative connector design in which a convex elastomeric surface is used to provide greater lead-in to the connectors.

Base 94 of connector half 90 also supports a conductor 96 extending substantially perpendicularly thereto downward from base 94 within the space defined by engagement walls 88 and 92 to be received against the free conductive finger 28a between it and the wall 98 (as shown in FIG. 13) so as to provide electrical contact between the two. Conductor 96 may also be a relatively malleable material like the conductive fingers 22 of printed circuit board 10 as it is supported by guide wall 98 against normal force imposed by wall 98.

As is also shown in FIGS. 12 and 13, additional inward flexibility of free conductive trace 22a toward the electrically isolated pillar 24 may be provided by the insertion of an elastomeric element 102 between the free conductive trace 22a and wall 87 of the electrically isolated pillar 24. The elastomeric element 102 may compress upon the insertion of conductor 96 into the gap between free conductive trace 22a and guide wall 98 to provide a tight fit.

Referring now to 14, the possibility of misalignment of the tip of conductor 96 with the relatively narrow gap between guide wall 98 and free conductive trace 22a may be addressed by providing for a convex outer surface to the elastomeric element 102 and conforming the free conductive trace 22a to this surface and in this way providing for a greater acceptance window 104 for the conductor 96.

Figure 15:
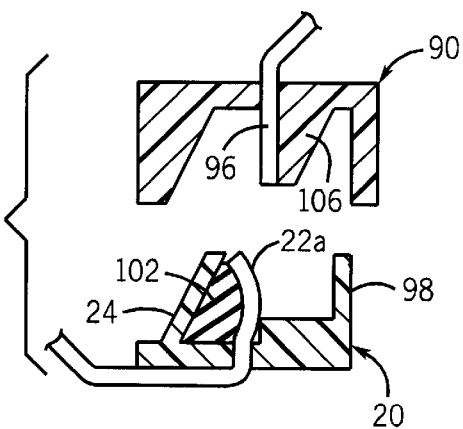
FIG. 15 is a figure similar to that of FIG. 14 showing a second connector half attachable to the connector half of FIG. 14 in which conductive fingers are supported by electrically isolated pillars in both connector halves.

Referring now to FIG. 15, connector half 90 may be augmented with a downwardly extending electrically isolated pillar 106 (having similar purpose to electrically isolated pillar 24) providing support for the conductor 96 during its insertion with connector 20. The pillar 106 prevents buckling of the conductor 96 and provides for a support of conductor 96 against lateral forces imposed by the elastomeric element 102 on conductor 96 in engagement with free conductive trace 22a without the need for the support of guide wall 98 which now serves merely to guide into engagement the two connector halves 90 and 20.

Figure 16:
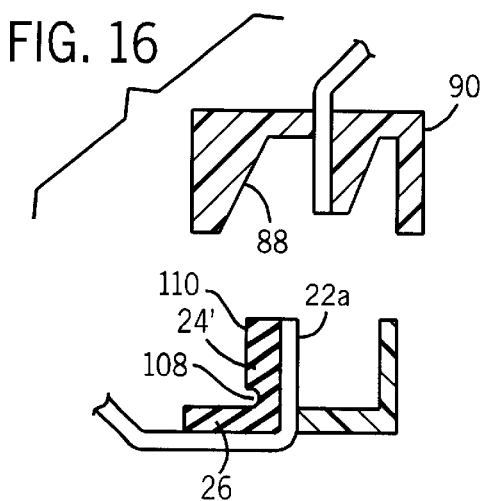
FIG. 16 is a figure similar to that of FIG. 12 showing an alternative connector half design in which one of separated connector halves holds the conductive finger against a hinging pillar.

Referring now to FIG. 16, in lieu of a fixed electrically isolated pillar 24, an electrically isolated pillar 24' may be provided having a cut-out 108 providing a hinge point about the base plate 26 so that an outer wall 110 of the electrically isolated pillar 24' opposite the free conductive finger 22a, when engaged by the inner sloping engagement wall 88 of the connector half 90 is bent inward as shown in FIG. 6 per arrow 111 so that the free conductive trace 22a attached to the side of the electrically isolated pillar 24' away from wall 110 is pressed against the conductor 96 when the connector halves 90 and are fully engaged.

Referring now to FIG. 18, electrically isolated pillar 24 may form one wall of a generally box-shaped shell 112. The opposing guide wall 98 provides for guidance of a mating connector as has been described above. The electrically isolated pillar 24 may be cantilevered with respect to the other walls so as to provide for some outward flexure along arrow 114 with the insertion of conductor 96 and possibly supporting pillar 106. The base plate 26 may be extended and have locking prongs 116 which may lock according to techniques well known in the art with corresponding apertures in the mating connector half 90 (not shown in FIG. 18).

Referring now to FIG. 19 in yet another embodiment, the base plate 26 may support a isolated pillar 24 having a sloped wall 121 opposed to upstanding wall 98 to create therebetween a concave upwardly opening cavity 120 to receive a complimentary wedge-shaped plug 122 of connector half 90. The conductive finger 22 is supported by the sloped wall 121 of the isolated pillar 22. A corresponding portion of the plug 122 has a corresponding conductor 96 so that when the plug 122 is placed within the cavity 120 a diagonal lap joint is created between conductors 122 and 96. The connector 90 may have additional outer walls 124 fitting about the outer surfaces of wall 98 and isolated pillar 24.

Figure 17:
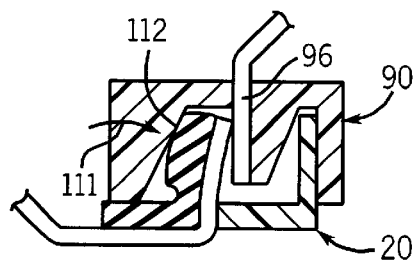
FIG. 17 is a figure similar to that of FIG. 15 showing engagement of the two connector halves of FIG. 15 upon which the hinging pillar is pressed into engagement with an opposed connector pin by operation of a camming surface on the engaging connector half.

Referring now to FIG. 20, the embodiment of FIGS. 16 and 17 may be modified slightly making use of the overhang 40 described with respect to FIG. 3, so that the isolated pillar 24' may capture the conductive finger 22' at its upward end under an overhang 40'. Similarly, conductor 96 may be captured by over-hang 40" on supporting structure 140 from connector half 90. Referring also to FIG. 21 the portion of isolated pillar 24 adjacent to conductor 96 when the conductors 22 and 96 are in contact may be given a convex radius 126 so that the area of contact 128 between conductors 22' and 96 approximates the intersection between a plane and a cylinder being a single line of contact providing greater contact pressure and better electrical connection.

Referring still to FIG. 20, the engagement wall 18 described above with respect to FIGS. 16 and 17 and serving to wedge the isolated pillar 24' toward the conductor 96, by that action produces a disengaging force 128 on connector shell 90 that increases as the two connector shells are engaged. In part, this force 128 represents friction between engagement wall 88 and the surfaces of the isolated pillar 24 and other inter-engaging surfaces of the connectors 20 and 90 which experience a normal force to their sliding engagement caused by the engagement wall 18 pushing laterally on those surfaces such as increases friction.

Referring now to FIG. 22, these forces may be reduced by eliminating the engagement wall 88 to allow the connectors 90 and 20 to be engaged with each other without significant forces normal to the direction of engagement such as increases friction. Subsequent to connection of the connector halves 20 and 90, a wedge-key 130 having an expanded section 136 may be inserted through an aperture 132 in one of the connectors 90 and 20 to fit between an upstanding wall 134 attached to the base plate 26 adjacent to the isolated pillar 24 and isolated pillar 24 so as to wedge the isolated pillar 24 away from wall 134 and toward supporting structure 140 holding conductor 96. Total frictional forces on the wedge-key 130 are limited by its reduced area of contact between itself and walls 134 and isolated pillar 124.

The wedge-key 130 in the embodiment of FIG. 22 provides an elongate shaft 142 with an expanded section 136 which wedges the isolated pillar 24 away from wall 134 and toward supporting structure 140. Alternatively a wedged-shaped design similar to the engagement wall 88 of FIG. 20 could be adopted. Note that the supporting structure 140 and isolated pillar 24 may both be given a opposed convex surface so that conductors 22 and 96 touch as the intersection of two cylinders to provide improved electrical contact.

Referring to FIG. 23 a similar design as that shown in FIG. 22 may be adopted with the supporting structure 140 being a downwardly extending wall from connector shell 90 and holding on its surface a crimp connector 34' having a crimp section 144 for attaching a conventional wire 146 and a spring metal hook portion 148 flexing inward as shown by arrow 150 upon pressure by the conductor 22 supported by isolated pillar 24. The wedge-key 130 may be held partially captive in shell 90 or may be a removable element added after interconnection of shells 90 and 20.

Referring now to FIG. 25, the wedge-key 130 may in fact be a straight bar serving to move the isolated pillar 24 toward the support structure 140 by action of the wedge-key 130 against a sloped surface of wall 134 providing progressively less separation between this surface and a rear surface of isolated pillar 24. Thus the wedge-key need not be wedge-shaped but may operate as a shim with the wedging action provided by the structure of the connector shell 20.

The above description has been that of a preferred embodiment of the present invention, it will occur to those that practice the art that many modifications may be made without departing from the spirit and scope of the invention. In order to apprise the public of the various embodiments that may fall within the scope of the invention, the following claims are made.

We claim:

1. A circuit board connector assembly comprising:
    a printed circuit board having a lower insulating substrate with a planar portion and an upper conductive layer, the upper conductive layer having at least one unitary extenuate conductive finger bent back from the substrate to extend at an angle to the planar portion of the substrate;
    a connector half receiving and supporting the conductive finger, the connector half sized to mate with a second connecto2 half having a second conductive finger, the mating of the connector half with the second connector half positioning the conductive finger and second conductive finger in electrical contact;
    whereby a continuous conductive path is provided from the printed circuit board to the connector half.

2. The circuit board connector assembly of claim 1 wherein the conductive finger is supported on the connector half by an electrically isolated pillar.

3. The circuit board connector assembly of claim 2 wherein the electrically isolated pillar is composed of an electrical insulator.

4. The circuit board connector assembly of claim 2 wherein the electrically isolated pillar is molded of a thermoplastic polymer as an integral part of the connector half.

5. The circuit board connector assembly of claim 2 wherein the electrically isolated pillar has an elastomeric outer portion.

6. The circuit board connector assembly of claim 5 wherein the elastomeric outer portion beneath the conductive finger presents a convex surface.

7. A circuit board connector assembly comprising:
a printed circuit board defining a generally planar body and having a lower insulating substrate and an upper conductive layer, the upper conductive layer having at least one extenuate conductive finger bent back towards itself to extend at an angle to the planar body;
a connector half receiving and supporting the conductive finger, the connector half sized to mate with a second connector half having a second conductive finger, the mating of the connector half with the second connector half positioning the conductive finger and second conductive finger in electrical contact;
whereby a continuous conductive path is provided from the printed circuit board to the connector half;
wherein the insulating substrate of the printed circuit board is flexible and cut around the conductive finger; and wherein the insulating substrate remains attached to the upwardly bent conductive finger.

8. A circuit board connector assembly comprising:
a printed circuit board having a lower insulating substrate and an upper conductive layer, the upper conductive layer having at least one unitary extenuate conductive finger separated and bent upward from an adjacent surface of the printed circuit board;
a connector half receiving and supporting the conductive finger, the connector half sized to mate with a corresponding connector half having a second conductive finger, the mating of the connector half with the second connector half positioning the conductive finger and second conductive finger in electrical contact;
whereby a continuous conductive path is provided from the printed circuit board to the connector half;
wherein the conductive finger is supported on the connector half by an electrically isolated pillar;
wherein the conductive finger is longer than the height of the electrically isolated pillar and attached to a first side of the electrically isolated pillar and bent over the top of the electrically isolated pillar to further attach to a second side of the electrically isolated pillar obverse to the first side.

9. A circuit board connector assembly comprising:
a printed circuit board having a lower insulating substrate and an upper conductive layer, the upper conductive layer having at least one extenuate conductive finger bent upward from an adjacent surface of the printed circuit board;
a connector half receiving and supporting the conductive finger, the connector half sized to mate with a second connector half having a second conductive finger, the mating of the connector half with the second connector half positioning the conductive finger and second conductive finger in electrical contact;
whereby a continuous conductive path is provided from the printed circuit board to the connector half;
wherein the conductive finger is supported on the connector half by an electrically isolated pillar and the conductive finger is longer than the height of the electrically isolated pillar and attached to a first side of the electrically isolated pillar and bent over the top of the electrically isolated pillar to further attach to a second side of the electrically isolated pillar obverse to the first side; and wherein the connector half includes a base having a downwardly extending barb sized to be inserted through a stabilizing support to mechanically fix the connector half to the stabilizing support, the base running there along and further including:
an outer shell having guide surfaces interfitting with corresponding guide surfaces on the connector half, the outer shell further having a cover plate with aperture for receiving the electrically isolated pillar and conductive finger to extend therethrough to sandwich portions of the conductive finger between the base and the cover plate, the cover plate further including second downwardly extending barbs to mechanically fix the cover plate against the base to the stabilizing support.

10. A circuit board connector assembly comprising:
a printed circuit board having a lower insulating substrate and an upper conductive layer, the upper conductive layer having at least one unitary extenuate conductive finger separated and bent upward from an adjacent surface of the printed circuit board;
a connector half receiving and supporting the conductive finger, the connector half sized to mate with a corresponding connector half having a second conductive finger, the mating of the connector half with the second connector half positioning the conductive finger and second conductive finger in electrical contact;
whereby a continuous conductive path is provided from the printed circuit board to the connector half;
wherein the conductive finger is supported on the connector half by an electrically isolated pillar;
wherein the conductive finger has a substantially rectangular cross-section having a back side, a front side, and a left and right edge and the electrically isolated pillar includes overhang portions that mechanically capture the left and right edges of the conductive finger to retain it against the electrically isolated pillar.

11. A circuit board connector assembly comprising:
a printed circuit board having a lower insulating substrate and an upper conductive layer, the upper conductive layer having at least one unitary extenuate conductive finger separated and bent upward from an adjacent surface of the printed circuit board;
a connector half receiving and supporting the conductive finger, the connector half sized to mate with a corresponding connector half having a second conductive finger, the mating of the connector half with the second connector half positioning the conductive finger and second conductive finger in electrical contact;
whereby a continuous conductive path is provided from the printed circuit board to the connector half;
wherein the conductive finger is supported on the connector half by an electrically isolated pillar;
wherein the electrically isolated pillar includes an overhang portion that mechanically captures an end of the conductive finger to retain it against the electrically isolated pillar.

12. A circuit board connector assembly comprising:
a printed circuit board having a lower insulating substrate and an upper conductive layer, the upper conductive layer having at least one extenuate conductive finger bent upward from an adjacent surface of the printed circuit board;
a connector half receiving and supporting the conductive finger, the connector half sized to mate with a second connector half having a second conductive finger, the mating of the connector half with the second connector half positioning the conductive finger and second conductive finger in electrical contact;

whereby a continuous conductive path is provided from the printed circuit board to the connector half;

wherein the conductive finger is supported on the connector half by an electrically isolated pillar; wherein the electrically isolated pillar includes an overhang portion that mechanically captures an end of the conductive finger to retain it against the electrically isolated pillar; and wherein the end of the conductive finger is beveled to provide a wedge-shaped engagement with the overhang portion of the electrically isolated pillar.

13. A circuit board connector assembly comprising:

a printed circuit board having a lower insulating substrate and an upper conductive layer, the upper conductive layer having at least one unitary extenuate conductive finger separated and bent upward from an adjacent surface of the printed circuit board;

a connector half receiving and supporting the conductive finger, the connector half sized to mate with a corresponding connector half having a second conductive finger, the mating of the connector half with the second connector half positioning the conductive finger and second conductive finger in electrical contact;

whereby a continuous conductive path is provided from the printed circuit board to the connector half;

wherein the conductive finger is supported on the connector half by an electrically isolated pillar;

wherein the conductive finger and electrically isolated pillar is plated with a continuous metallic layer.

14. A circuit board connector assembly comprising:

a printed circuit board having a lower insulating substrate and an upper conductive layer, the upper conductive layer having at least one extenuate conductive finger bent upward from an adjacent surface of the printed circuit board;

connector half receiving and supporting the conductive finger, the connector half sized to mate with a second connector half having a second conductive finger, the mating of the connector half with the second connector half positioning the conductive finger and second conductive finger in electrical contact;

whereby a continuous conductive path is provided from the printed circuit board to the connector half;

wherein the conductive finger is supported on the connector half by an electrically isolated pillar; and wherein the conductive finger and electrically isolated pillar is plated with a continuous metallic layer; and wherein a non-platable shroud encases the lower portions of the electrically isolated pillar.

15. A circuit board connector assembly comprising:

a printed circuit board having a lower insulating substrate and an upper conductive layer, the upper conductive layer having at least one extenuate conductive finger bent upward from an adjacent surface of the printed circuit board;

a connector half receiving and supporting the conductive finger, the connector half sized to mate with a second connector half having a second conductive finger, the mating of the connector half with the second connector half positioning the conductive finger and second conductive finger in electrical contact;

whereby a continuous conductive path is provided from the printed circuit board to the connector half;

wherein the conductive finger is supported on the connector half by an electrically isolated pillar; and wherein the electrically isolated pillar may flex with respect to the connector half and wherein the corresponding connector half includes a cam surface and an electrical contact, the cam surface flexing the electrically isolated pillar and the attached conductive finger toward the electrical contact when the connector half and corresponding connector half are mated.

16. A circuit board connector assembly comprising:

a printed circuit board having a lower insulating substrate and an upper conductive layer, the upper conductive layer having at least one unitary extenuate conductive finger separated and bent upward from an adjacent surface of the printed circuit board;

a connector half receiving and supporting the conductive finger, the connector half sized to mate with a corresponding connector half having a second conductive finger, the mating of the connector half with the second connector half positioning the conductive finger and second conductive finger in electrical contact;

whereby a continuous conductive path is provided from the printed circuit board to the connector half;

wherein the connector half includes downwardly extending barbs sized to be inserted through a stabilizing support to mechanically fix the connector half to the stabilizing support.

* * * * *

UNITED STATES PATENT AND TRADEMARK OFFICE
CERTIFICATE OF CORRECTION

PATENT NO. : 6,585,538 B2
DATED : July 1, 2003
INVENTOR(S) : Harvinder Singh et al.

Page 1 of 1

It is certified that error appears in the above-identified patent and that said Letters Patent is hereby corrected as shown below:

<u>Column 9,</u>
Line 9, "and are" should be -- and 20 are --.

<u>Column 10,</u>
Line 50, "connecto2" should be -- connector --.

Signed and Sealed this

Twenty-eighth Day of October, 2003

JAMES E. ROGAN
*Director of the United States Patent and Trademark Office*